United States Patent [19]

Perkins

[11] 4,103,737

[45] Aug. 1, 1978

[54] HEAT EXCHANGER STRUCTURE FOR ELECTRONIC APPARATUS

[75] Inventor: Calvin C. Perkins, Simi Valley, Calif.

[73] Assignee: Marantz Company, Inc., Chatsworth, Calif.

[21] Appl. No.: 751,156

[22] Filed: Dec. 16, 1976

[51] Int. Cl.² .................................................. F28F 13/08
[52] U.S. Cl. .......................................... 165/80; 165/109; 165/122; 165/146; 174/16 HS; 357/82; 361/384; 361/386
[58] Field of Search .................... 357/81, 82; 361/381, 361/382, 383, 384, 386; 174/15 R, 16 HS; 165/80, 109 T, 185, DIG. 3, 122, 146

[56] References Cited

U.S. PATENT DOCUMENTS

| 2,119,381 | 5/1938 | Cheeseman et al. | 357/82 |
| 2,909,714 | 10/1959 | Diebold | 357/82 |
| 2,943,283 | 6/1960 | Dorsett | 174/15 R |
| 3,212,569 | 10/1965 | McAdam | 357/81 |
| 3,213,324 | 10/1965 | McAdam | 165/80 |
| 3,548,927 | 12/1970 | Spurling | 357/81 |
| 3,652,903 | 3/1972 | Eriksson et al. | 357/82 |
| 3,741,292 | 6/1973 | Aakalu et al. | 357/82 |
| 3,746,947 | 7/1973 | Yamamoto et al. | 357/82 |

OTHER PUBLICATIONS

Adjustable air wedge for controlling air flow and reduction of air acoustic noise, Chu, IBM Tech. Disc. Bull., vol. 19, No. 11, 4-77.

Primary Examiner—Charles J. Myhre
Assistant Examiner—Sheldon Richter
Attorney, Agent, or Firm—Fulwider, Patton, Rieber, Lee & Utecht

[57] ABSTRACT

A chassis for an electronic apparatus having heat generating circuit components attached to heat exchangers along its top and bottom walls. Each heat exchanger includes a base from which parallel fingers project toward a plane passing horizontally through the center of the chassis, the various exchangers having fingers of differing lengths to define an air passage of varying effective cross-sectional area, thereby promoting air turbulence for increased cooling. The heat exchangers at the entrance to the air passage are aluminum, while those at the exit where the cooling air is warmest are copper.

12 Claims, 5 Drawing Figures

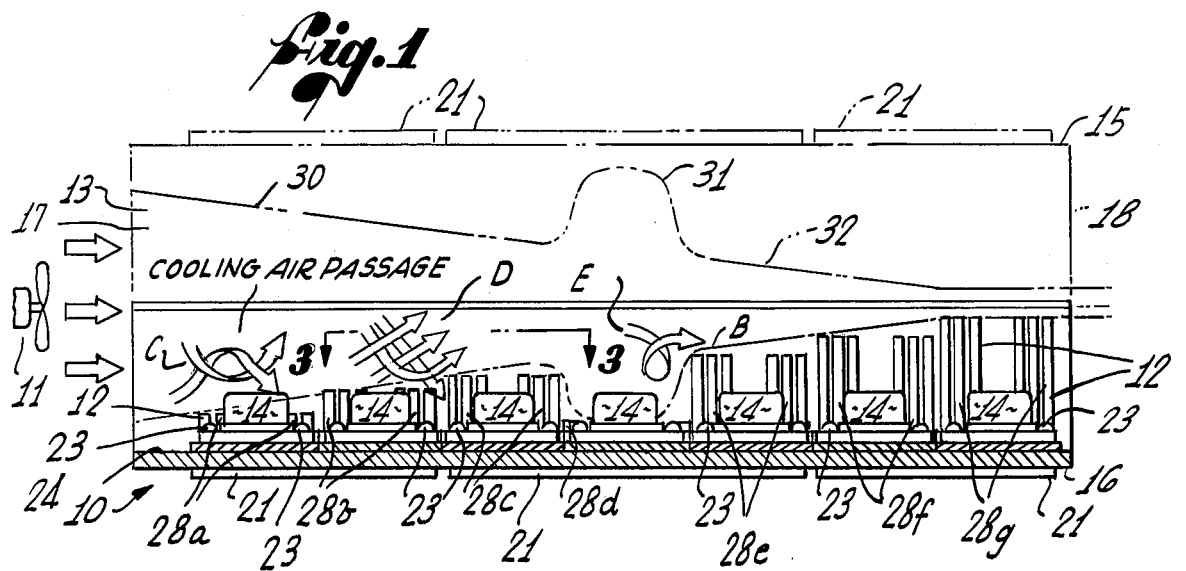
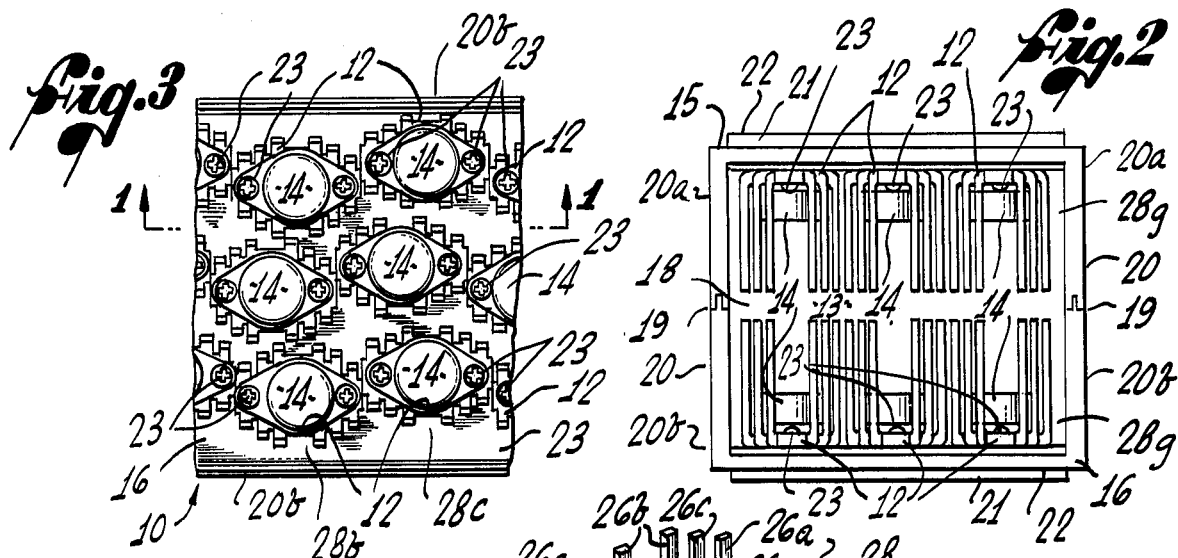
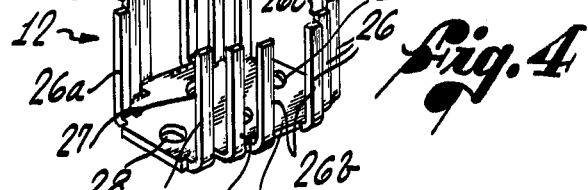
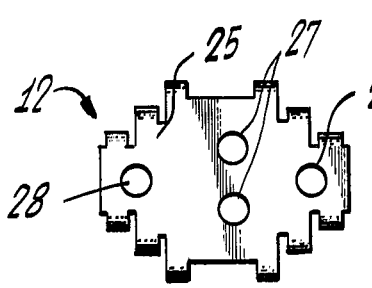
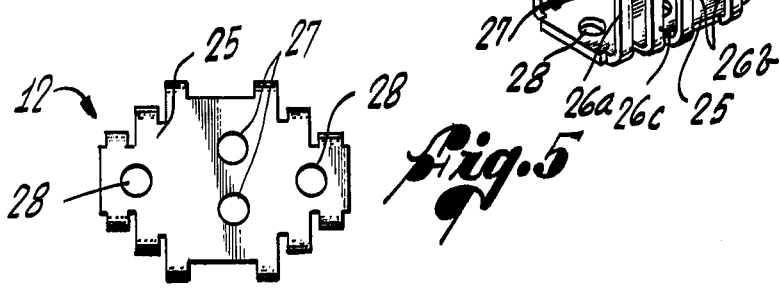

HEAT EXCHANGER STRUCTURE FOR ELECTRONIC APPARATUS

BACKGROUND OF THE INVENTION

The present invention relates to electronic apparatus, and more particularly to such apparatus in which heat exchangers are arranged along a passage for cooling air.

Electronic circuit components, especially those that operate at relatively high power levels, generate significant amounts of heat that must be dissipated efficiently since the characteristics of the components are not temperature stable beyond finite limits and an increase in temperature is generally accompanied by an increase in the distortion level. Modern solid state circuit components occupy relatively little space, and the spacing required between the components for heat dissipation is, therefore, a principal factor determining the overall size of the apparatus.

Heat dissipation is often problematic in the power stages of equipment, such as audio amplifiers, where power transistors and diodes are major heat sources. In many instances, heat from these components is radiated by heat exchangers arranged along the inside surfaces of chassis walls and carried away by cooling air blown through the chassis. As the size of the chassis decreases, the temperature tends to increase and greater blower power is needed to force an increased flow of adequate cooling air. It is generally desirable, however, that the requisite blower power be held to a minimum to reduce noise, size and power consumption.

A principal objective of the present invention is to provide a more effective configuration and arrangement of heat exchangers that more effectively dissipates heat within limited space and blower power parameters.

SUMMARY OF THE INVENTION

The present invention compises an electronic apparatus in which heat generating circuit components are associated with a plurality of heat exchangers that defines a passage for cooling air of varying effective cross-sectional area to promote air turbulence and more efficient heat dissipation. The invention is particularly suitable for use in the power stages of high quality audio amplifiers and similar equipment.

The heat exchangers are arranged on the inner surfaces of two opposing chassis walls, each heat exchanger having a base attached to one of the walls and a plurality of heat-radiating members, preferably elongated parallel fingers that project away from the base. The heat generating circuit components are mounted on the bases between the radiating members. Although all radiating members that are common to a single exchanger may be of the same length, the length varies from one exchanger to another to outline the desired passage profile.

In a preferred embodiment, the passage includes a vortical portion adjacent an entrance to the chassis having an effective cross-sectional area that decreases with the distance from the entrance, followed by a diffuser portion which has the largest effective cross-sectional area of any part of the passage. Adjacent the diffuser portion is a second vortical portion the effective cross-sectional area of which decreases with the distance to a chassis exit. The alternating vortical and diffuser portions have a mixing effect on the air flowing through the channels creating currents back and forth across the passage for increased cooling. The heat exchangers in a part of the second vortical portion adjacent the exit, where the cooling air is warmest, are of greatest length and are made of copper, which has a high transfer capability, the remaining heat exchangers being aluminum.

Other features and advantages of the present invention will become apparent from the following detailed description, taken in conjunction with the accompanying drawings which illustrate, by way of example, the principles of the invention.

BRIEF DESCRIPTION OF THE DRAWINGS

FIG. 1 is a cross-sectional view of an exemplary electrical apparatus embodying the present invention taken vertically and off-center along the cooling air passage, the upper half of the cross section being symmetrical with respect to the lower half and therefore shown in outline form only;

FIG. 2 is an end view of the apparatus showing the exit of the cooling air passage;

FIG. 3 is a fragmentary cross-sectional view of a portion of the upper half of the apparatus taken along the line 3—3 of FIG. 1;

FIG. 4 is an enlarged perspective view of a heat exchanger of the apparatus; and FIG. 5 is an enlarged bottom view of the heat exchanger.

DESCRIPTION OF THE PREFERRED EMBODIMENT

An exemplary embodiment of the present invention, shown in the accompanying drawings, is an electronic apparatus, such as a power amplifier for a high-fidelity audio system, that provides for increased turbulence of cooling air for more effective heat dissipation. In general, the apparatus includes a chassis or frame 10, a fan 11 for blowing cooling air through the chassis, a plurality of heat exchangers 12, a passage 13 for the cooling air between opposing heat exchangers, and a plurality of heat-generating circuit components 14 mounted on the heat exchangers.

The frame 10, as shown in FIG. 1, is generally rectangular having opposing top and bottom walls 15 and 16 and two open ends 17 and 18 forming an entrance and exit, respectively, for cooling air. The top and bottom halves of the chassis 10 are separable, for ease of assembly and repair of the apparatus, along the horizontal center lines 19 of two vertical sidewalls 20, the upper and lower portions 20a and 20b of the sidewalls forming a tongue-and-groove interlocking joint throughout their lengths. Printed circuit boards 21 are mounted on the exterior surfaces 22 of the top and bottom walls 15 and 16. The blower 11 is positioned at the entrance 17 to blow cooling air through the chassis 10 along its longer horizontal axis.

The heat exchangers 12 are mounted by screw fasteners 23 on the opposing interior surfaces 24 of the top and bottom walls 15 and 16, arranged according to a pattern that is repeated on the top and bottom of the chassis for vertical symmetry. Each heat exchanger 12 is a stamping from a single metal sheet of uniform thickness and includes a flat base 25 that overlies a small part of the top or bottom wall and a plurality of upstanding heat-radiating members in the form of elongated parallel fingers 26 normal to the base and projecting toward a plane passing horizontally through the center of the chassis 10. In this preferred embodiment the heat exchangers 12 have twelve fingers arranged in pairs. As shown in FIG. 4, the base 25 is narrowest at its two ends where the fingers of the pairs 26a are closest together and widest in the center where the fingers 26b of two adjacent pairs are spaced apart by the greatest distance. The interstitial pairs of fingers 26c are spaced apart by an intermediate distance, and the base 25 has a stepped outline, as shown in FIG. 5, to accommodate the finger of each pair at the desired distance. Although the length of the fingers 26 varies from one heat exchanger 12 to another, as explained more fully below, the fingers of any one exchanger are of uniform length.

The circuit elements 14, which include power transistors and diodes and may include other components that are significant heat sources, are each nested within one of the heat exchangers 12 and surrounded by the fingers 26 as shown in FIG. 3. Lead wires (not shown) extend from the circuit elements 14 through holes 27 in the base 25 of the heat exchanger to the circuit boards 21 by which the elements are interconnected. More widely spaced holes 28 in the bases 25 facilitate connection to the chassis 10 by the screws 23. The circuit elements 14 are in conductive thermal communication with the heat exchangers 12 so that the heat generated by those elements is radiated by the fingers 26.

The vertically opposed fingers that project from the top and bottom walls 15 and 16 define between them the general outline of the passage 13 through which cooling air from the blower 11 can flow freely, the approximate profile of this passage being indicated in FIG. 1 by broken lines A and B. The area of a plane cutting across the passage 13 normal to the direction of overall cooling air flow from the entrance 17 to the exit 18 in which air can flow freely without passing along the sides of the fingers is defined as the effective cross-sectional area of the passage. It is recognized, however, that the air is not confined to the passage, but constantly flows into the area of the heat exchanger fingers 26 and back into the passage again. The cross section of the passage 13 at the chassis exit 17 is depicted in the end view of FIG. 2.

If the air were to move straight through the passage 13 in a laminar manner without being diverted from the passage to flow across the surfaces of the heat exchangers 12, heat would not be dissipated as effectively as desired. Heat dissipation is greatly improved, however, by air turbulence within the passage 13 that disrupts laminar flow and any tendency of the cooling air to stay within the passage 13. Some turbulence results from a swirl impaired to the cooling air by the rotation of the blower 11, but, according to the invention, the turbulence of the cooling air and its effect on the heat exchangers 12 is substantially improved by variations in the lengths of the fingers 26 along the passage 13.

The heat exchangers 12 are arranged in rows 29a – 29g that extend across the passage 13, although the exchangers of a row need not be fully aligned, as can be seen in FIG. 2. The length of the fingers 26 of the three rows 29a – 29c of heat exchangers nearest the entrance 17 to the chassis 10 increase progressively from one row to the next, thereby defining a first vortical portion 30 of the passage 13. The effective cross-sectional area of this first vortical portion 30 decreases with increasing distance from the adjacent entrance 17. To the extent that the cooling air stays within the passage 13, it is compressed and its velocity increases, causing increased swirling and turbulence as indicated by the arrows C and D.

Although turbulence can be beneficially increased by a passage having continuous vortical outline extending from the entrance 17 to the exit 18 of the chassis 10, turbulence is further enhanced by a diffuser portion 31 in which the outline of the passage profile is defined by a single row of heat exchangers 29d having the shortest fingers 26 included in the apparatus to give the passage 13 its maximum effective cross-sectional area. The diffuser portion 31, which is adjacent the narrow end of the first vortical portion 30 and is centrally located between the entrance 17 and exit 18, causes the cooling air to expand outwardly in a direction normal to its flow through the passage 13 creating a larger swirl as indicated by the arrow E in FIG. 1.

Adjacent to the diffuser portion 31 at one end and the exit 18 at the other is a second vortical portion 32 of the passage 13 formed by three rows 29e 29f and 29g of heat exchangers 12. The effective cross-sectional area of the second vortical portion 32 decreases with the distance to the exit 18 to again increase the turbulence and swirl of the cooling air in the same manner as the first vortical portion 30. Apart from interruption of the diffuser portion 31, the second vortical portion 32 forms a continuation of the first vortical portion 30 with the shortest fingers 26 being longer than the longest fingers of the first vortex portion. Accordingly, the cross-sectional area of the passage 13 at the mouth of the second vortical portion 32 adjacent the diffuser portion 31 is smaller than at the end of the first vortical portion 30 adjacent the diffuser.

As the cooling air moves through the passage 13 its temperature increases continuously and its cooling effect is lessened accordingly. To some extent, this increase in cooling air temperature is offset by the fact that, with the exception of the heat exchangers 12 in the diffuser portion 21, the length of the fingers 26 increases from the entrance 17 to the exit 18, thereby presenting a generally increasing radiating surface area as the cooling air temperature increases. To further compensate for the increase in cooling air temperature, the heat exchangers of the two rows 29f and 29g nearest the exit 18 are formed of a metal having a greater heat dissipation capability than the metal of which the other heat exchangers are formed. Heat dissipation capability is defined as a comparative measure of the amount of heat dissipated over a fixed radiating surface with other conditions such as the difference between the temperature of the metal and the temperature of the cooling air also being standardized. In this embodiment, the heat exchangers 12 of the last two rows 29f and 29g are copper, which has a relatively high heat dissipation capability and the remaining heat exchangers are aluminum which has a lower heat disspation capability.

While a particular form of the invention has been illustrated and described, it will be apparent that various modifications can be made without departing from the spirit and scope of the invention.

I claim:
1. An electronic apparatus comprising:
a chassis having two parallel walls with opposing internal surfaces and two open ends forming an entrance and exit;
a plurality of heat exchangers each formed of a single metal sheet of uniform thickness, having a base overlying one of said walls and a plurality of parallel, elongated fingers of uniform length extending away from said one wall and normal to said base; and
a plurality of electrically interconnected circuit elements, including at least one power transistor, each said element being mounted on said base of one of said heat exchangers and surrounded by said fingers of said heat exchanger;

said fingers of different heat exchangers being of different lengths and being arranged according to a predetermined pattern to define between them a passage for cooling air extending from said entrance to said exit, said passage comprising a first vortical portion adjacent said entrance having an effective cross-sectional area that decreases with increasing distance from said entrance, a diffuser portion in which said passage is of maximum effective cross-sectional area centered between said entrance and said exit, and a second vortical portion adjacent said exit in which said passage is of minimum effective cross-sectional area, the effective cross-sectional area of said second vortical portion decreasing with decreasing distance from said exit.

2. The apparatus of claim 1, wherein the effective cross-sectional area of said first vortical portion at the end thereof adjacent said diffuser portion is greater than the effective cross-sectional area of said second vortical portion at the end thereof adjacent said exit.

3. The apparatus of claim 1, wherein the fingers of each heat exchanger are arranged in pairs, said fingers of said pairs at the ends of said base being more closely spaced than those at the center of said base.

4. An electronic apparatus comprising:
a chassis having two open ends forming an entrance and an exit;
a plurality of heat exchangers each formed of a single metal sheet of uniform thickness, having a base overlying a portion of said chassis and a plurality of elongated fingers extending away from said base; and
a plurality of electrically interconnected circuit components each mounted on said base of one of said heat exchangers and surrounded by said fingers of said heat exchanger;
said fingers of different heat exchangers being of different lengths and being arranged according to a predetermined pattern to define between them a passage for cooling air extending from said entrance to said exit, said passage comprising a first vortical portion adjacent said entrance having an effective cross-sectional area that decreases with increasing distance from said entrance, a diffuser portion in which said passage is of maximum effective cross-sectional area centered between said entrance and said exit, and a second vortical portion adjacent said exit, the effective cross-sectional area of said second vortical portion decreasing with decreasing distance from said exit.

5. An electronic apparatus comprising:
a chassis having two parallel walls with opposing internal surfaces and two open ends forming an entrance and an exit;
a plurality of heat exchangers each having a base mounted on one of said walls and a plurality of heat-radiating members attached to said base and extending away from said one of said walls;
said plurality of heat exchangers including heat exchangers of a first metal and heat exchangers of a second metal, said second metal having a heat dissipation capability substantially greater than that of said first metal, said heat exchangers of said second metal being located closest to said exit; and
a plurality of heat-generating circuit elements each mounted on said base of one of said heat exchangers between said radiating members;
said radiating members being of different lengths and arranged according to a predetermined pattern to define a cooling air passage of varying effective cross-sectional area extending through said chassis from said entrance to said exit, thereby promoting turbulence in said cooling air.

6. The apparatus of claim 5 wherein said first metal is aluminum and said second metal is copper.

7. The apparatus of claim 5, wherein said heat exchangers of said second metal have radiating members of greater length than those of said heat exchangers of said first metal.

8. An electronic apparatus comprising:
a chassis having two parallel walls with opposing internal surfaces and two open ends forming an entrance and exit;
a plurality of heat exchangers each formed of a single metal sheet of uniform thickness, having a base overlying one of said walls and a plurality of parallel, elongated fingers of uniform length extending away from said one wall and normal to said base; and
a plurality of electrically interconnected circuit components, including at least one power transistor, each said element being mounted on said base of one of said heat exchangers and surrounded by said fingers of said heat exchanger;
said fingers of different heat exchangers being of different lengths and being arranged according to a predetermined pattern to define between them a passage for cooling air extending from said entrance to said exit, said passage comprising a first vortical portion adjacent said entrance having an effective cross-sectional area that decreases with increasing distance from said entrance, a diffuser portion in which said passage is of maximum effective cross-sectional area centered between said entrance and said exit, and a second vortical portion adjacent said exit in which said passage is of minimum effective cross-sectional area, the effective cross-sectional area of said second vortical portion decreasing with decreasing distance from said exit;
some of said heat exchangers being copper and the remainder of said heat exchangers being aluminum, said copper heat exchangers defining at least part of said second vortical portion.

9. The apparatus of claim 8, wherein the effective cross-sectional area of said first vortical portion at the end thereof adjacent said diffuser portion is greater than the effective cross-sectional area of said second vortical portion at the end thereof adjacent said exit.

10. The apparatus of claim 8, wherein the fingers of each heat exchanger are arranged in pairs, said fingers of said pairs at the ends of said base being more closely spaced than those at the center of said base.

11. The apparatus of claim 8, wherein said first metal is aluminum and said second metal is copper.

12. The apparatus of claim 8, wherein said heat exchangers of said second metal have radiating members of greater length than those of said heat exchangers of said first metal.

* * * * *